United States Patent
Xu (10) Patent No.: US 10,116,347 B1
(45) Date of Patent: Oct. 30, 2018

(54) LOSSLESS SWITCH FOR RADIO FREQUENCY FRONT-END MODULE

(71) Applicant: CoolStar Technology, Inc., Sunnyvale, CA (US)

(72) Inventor: Shuming Xu, Sunnyvale, CA (US)

(73) Assignee: Coolstar Technology, Inc., Sunnyvale, CA (US)

(*) Notice: Subject to any disclaimer, the term of this patent is extended or adjusted under 35 U.S.C. 154(b) by 0 days.

(21) Appl. No.: 15/398,774

(22) Filed: Jan. 5, 2017

(51) Int. Cl.
*H04B 1/44* (2006.01)

(52) U.S. Cl.
CPC ........................ *H04B 1/44* (2013.01)

(58) Field of Classification Search
CPC ... H04B 1/44; H04B 1/48; H04B 1/52; H04B 1/58
See application file for complete search history.

(56) References Cited

U.S. PATENT DOCUMENTS

| | | | |
|---|---|---|---|
| 2013/0035048 A1* | 2/2013 | Chee ...................... | H04B 1/525 455/83 |
| 2016/0043710 A1* | 2/2016 | Crandall ................ | H03K 17/04 327/374 |
| 2016/0133645 A1* | 5/2016 | Crandall ............. | H01L 27/1211 455/73 |

OTHER PUBLICATIONS

AFEM-S105 5 GHz WiFi FEM Data Sheet, Avago Technologies, May 2012, pp. 1-11.

\* cited by examiner

*Primary Examiner* — Xin Jia
(74) *Attorney, Agent, or Firm* — Otterstedt, Ellenbogen & Kammer, LLP (57) ABSTRACT

An integrated front-end module (FEM) includes at least one power amplifier (PA) coupled to an antenna without inclusion of a switching element in a transmit signal path in the FEM between an output of the PA and the antenna. The FEM further includes at least one low-noise amplifier (LNA) and a switching circuit coupled in a receive signal path of the FEM between the antenna and an input of the LNA. The switching circuit is configured in a first mode to disable the PA and to connect the input of the LNA to the antenna for receiving signals from the antenna. The switching circuit is configured in a second mode to disconnect the input of the LNA from the antenna and to enable the PA for transmitting signals to the antenna.

20 Claims, 8 Drawing Sheets

LOSSLESS SWITCH FOR RADIO FREQUENCY FRONT-END MODULE

FIELD

The present invention relates generally to the electrical, electronic and computer arts, and, more particularly, to switching circuitry for integrated front-end modules.

BACKGROUND

High-performance wireless (e.g., Wi-Fi, WiMAX, etc.) router and/or networking applications, such as, for example, multiple-input multiple-output (MIMO) 4×4 systems, generally employ a front-end module (FEM) which comprises one or more power amplifiers (PAs) and one or more low noise amplifiers (LNAs). The PA is employed to transmit radio frequency (RF) signals to an antenna, and the LNA is employed to receive RF signals from the antenna; an RF switch is utilized to selectively couple the antenna to either the PA or the LNA.

In many cases, there will be an insertion loss (typically in a range of about 0.2 decibels (dB) to 2.5 dB, or higher) attributable to the RF switch, which is undesirable; this insertion loss generally increases with increasing power and/or frequency. Although there are some known solutions for reducing switch insertion loss in the RF front-end module using complementary metal-oxide-semiconductor (CMOS) technology, such solutions are limited to low-power applications due to poor efficiency. For high-performance front-end modules, the technology used to fabricate the PA is based on a gallium arsenide (GaAs) substrate, while the technology used to fabricate the LNA is based on a CMOS silicon substrate, and the RF switch is typically fabricated on a silicon-on-insulator (SOI) or silicon-on-sapphire (SOS) substrate or as a micro-electromechanical systems (MEMS) device. The different materials and technologies, however, make it particularly challenging to integrate the various front-end components on the same substrate.

SUMMARY

One or more embodiments of the present invention provide techniques for connecting a power amplifier (PA) to an antenna in a transmit signal path of a front-end module (FEM) without insertion loss, while maintaining excellent isolation between the transmit signal path and a receive signal path in the FEM.

In accordance with one embodiment, an integrated FEM includes at least one PA coupled to an antenna without inclusion of a switching element in a transmit signal path in the FEM between an output of the PA and the antenna. The FEM further includes at least one LNA and a switching circuit coupled in a receive signal path of the FEM between the antenna and an input of the LNA. The switching circuit is configured in a first mode to disable the PA and to connect the input of the LNA to the antenna for receiving signals from the antenna. The switching circuit is further configured in a second mode to disconnect the input of the LNA from the antenna and to enable the PA for transmitting signals to the antenna.

In accordance with another embodiment, an integrated circuit includes a semiconductor substrate and at least one FEM formed on the substrate. The FEM includes at least one PA coupled to an antenna without inclusion of a switching element in a transmit signal path between an output of the PA and the antenna. The FEM further includes at least one LNA and a switching circuit coupled in a receive signal path between the antenna and an input of the LNA. The switching circuit is configured in a first mode to disable the PA and to connect the input of the LNA to the antenna for receiving signals from the antenna. The switching circuit is configured in a second mode to disconnect the input of the LNA from the antenna and to enable the PA for transmitting signals to the antenna.

Techniques according to embodiments of the present invention provide substantial beneficial technical effects. By way of example only and without limitation, one or more embodiments provide techniques for forming a lossless switch for use in an RF FEM having one or more of the following advantages, among other benefits:

reduces or eliminates insertion loss due to the RF switch in the signal path between the PA and the antenna in the FEM;
  enables integration of the RF FEM in a single die, thereby reducing the solution size;
  improves linearity in the FEM;
  enables high isolation in both transmit and receive signal paths at low and high frequencies;
  reduces overall power consumption in the FEM;
  improves reliability of the FEM;
  provides a silicon-based technology which is fully integratable with CMOS-based functional blocks to achieve system-on-chip (SOC);
  reduces the overall cost of the RF FEM.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative radio frequency (RF) front-end modules (FEMs) including improved switching circuitry for providing a lossless connection between an antenna and a power amplifier (PA) in a transmit signal path of the FEM, while maintaining superior isolation between the transmit signal path and a receive signal path in the FEM. It is to be appreciated, however, that the invention is not limited to the specific devices and fabrication methods illustratively shown and described herein. Rather, aspects of the present disclosure relate more broadly to techniques for forming a lossless RF switch for use in an FEM. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator semiconductor field-effect transistor. The term MISFET is, for example, intended to encompass semiconductor field-effect transistors that utilize an oxide material as their gate dielectric (i.e., metal-oxide semiconductor field-effect transistors (MOSFETs)), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal, such as, for instance, polysilicon; the terms "MISFET" and "MOSFET" are used interchangeably herein.

Although the overall fabrication method and devices formed thereby, as will be described in further detail herein below, are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit (IC) devices may not be explicitly shown in a given figure for economy of description. This does not imply, however, that the semiconductor layer(s) and/or region(s) not explicitly shown are omitted in the actual integrated circuit device.

Figure 1A:
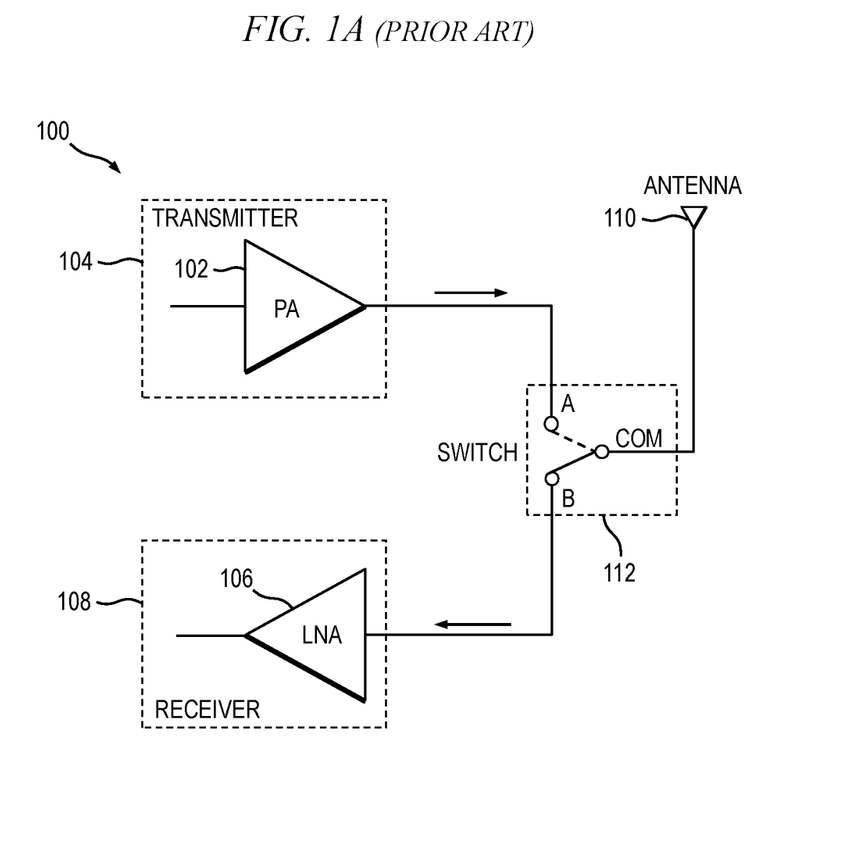
FIGS. 1A and 1B are a simplified block diagrams which conceptually illustrate exemplary front-end modules (FEMs) which can be modified to implement aspects of the present invention.
Figure 1B:
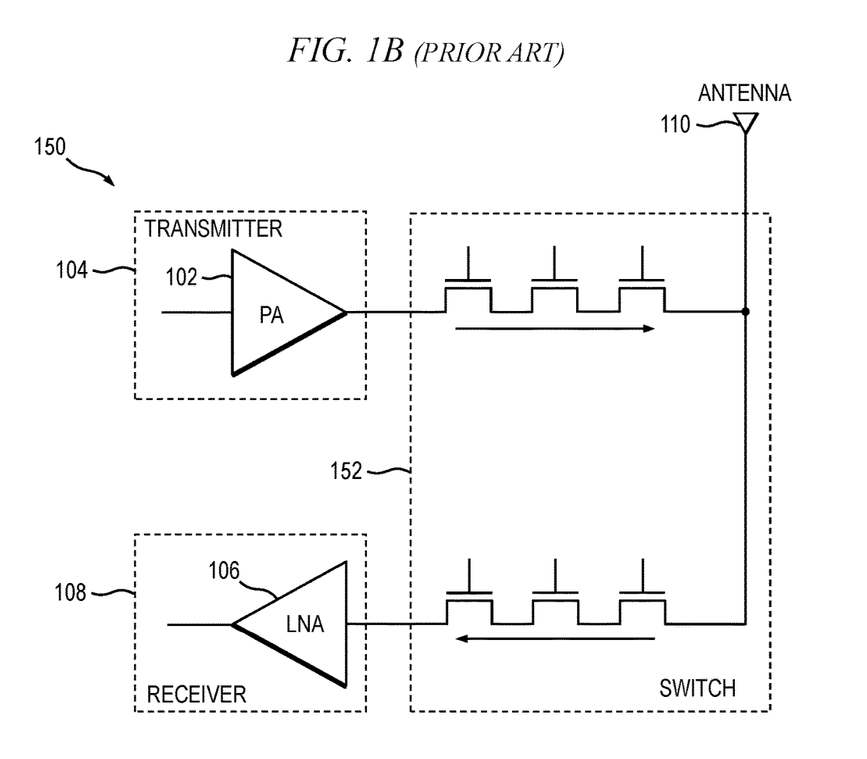

As previously stated, high-performance wireless applications, such as, for example, multiple-input multiple-output (MIMO) 4×4 systems, generally employ an FEM which includes one or more PAs and one or more LNAs coupled to an antenna through an RF switch. The PA is employed to transmit RF signals to the antenna and the LNA is employed to receive RF signals from the antenna. FIGS. 1A and 1B are a simplified block diagrams which conceptually illustrate exemplary front-end modules (FEMs) which can be modified to implement aspects of the present invention.

With reference to FIG. 1A, an FEM 100 comprises a PA 102, which may be part of transmitter circuitry 104 in a transmit signal path of the FEM, and an LNA 106, which may be part of receiver circuitry 108 in a receive signal path of the FEM. The PA 102 is configured to transmit RF signals to an antenna 110, and the LNA 106 is employed to receive RF signals from the antenna. An RF switch 112 coupled to the antenna 110 is utilized to switch a connection of the antenna between the PA 102 and the LNA 106. The RF switch 112 functions primarily to allow the transmitter circuitry 104 and receiver circuitry 108 to share a single antenna 110. The RF switch 112 is represented symbolically in FIG. 1 as a single-pole double throw (SPDT) switch, although various implementations of the RF switch are contemplated in accordance with aspects of the invention, some of which will be described in further detail below. It is to be appreciated that in a conventional FEM implementation, the PA 102, LNA 106 and RF switch 112 are usually not integrated on the same substrate (e.g., silicon), according to one or more embodiments. Advantageously, one or more embodiments of the invention integrate a PA, LNA and RF switch on the same substrate.

The FEM 100 is operative in at least two modes. In a first (transmit) mode of operation, the RF switch 112 is configured having its common terminal (COM) connected to terminal A, whereby an output of the PA 102 is electrically coupled with the antenna 110, through the RF switch, for transmitting RF signals to the antenna, and an input of the LNA 106 is left unconnected. In a second (receive) mode, the RF switch 112 is configured having its common terminal connected to terminal B, whereby the input of the LNA 106 is electrically coupled with the antenna 110 for receiving RF signals therefrom, and the output of the PA 102 is left unconnected. In one or more embodiments of the present invention, more than two modes of operation may be employed (e.g., Bluetooth mode) in the FEM.

Ideally, the RF switch 112 exhibits zero insertion loss in the transmit signal path while in the first mode of operation, and infinite isolation between transmit and receive signal paths while in the second mode of operation. However, in practice there is always at least some insertion loss attributable to an on-resistance of the transistors often used to implement the RF switch 112, typically in a range of about 0.2 decibels (dB) to 2.5 dB or higher, and some finite signal leakage (e.g., crosstalk), typically about −30 dB to about −25 dB at frequencies in the gigahertz (GHz) range, between the two terminals (A and B) of the switch. Isolation can be improved by adding more switch stages, although doing so increases the insertion loss. By way of example, FIG. 1B is a schematic diagram depicting a conventional solution of switching devices, where an illustrative FEM 150 includes an RF switch 152 comprising a plurality of transistor switches connected in series in both the transmit and receive signal paths of the FEM. Moreover, since power is proportional to a square of the current, and since the current flowing in the transmit signal path will be much higher than the current flowing in the receive signal path, the on-resistance of the transistor switches will have a significantly greater detrimental impact on the transmit signal path compared to the receive signal path.

Figure 2:
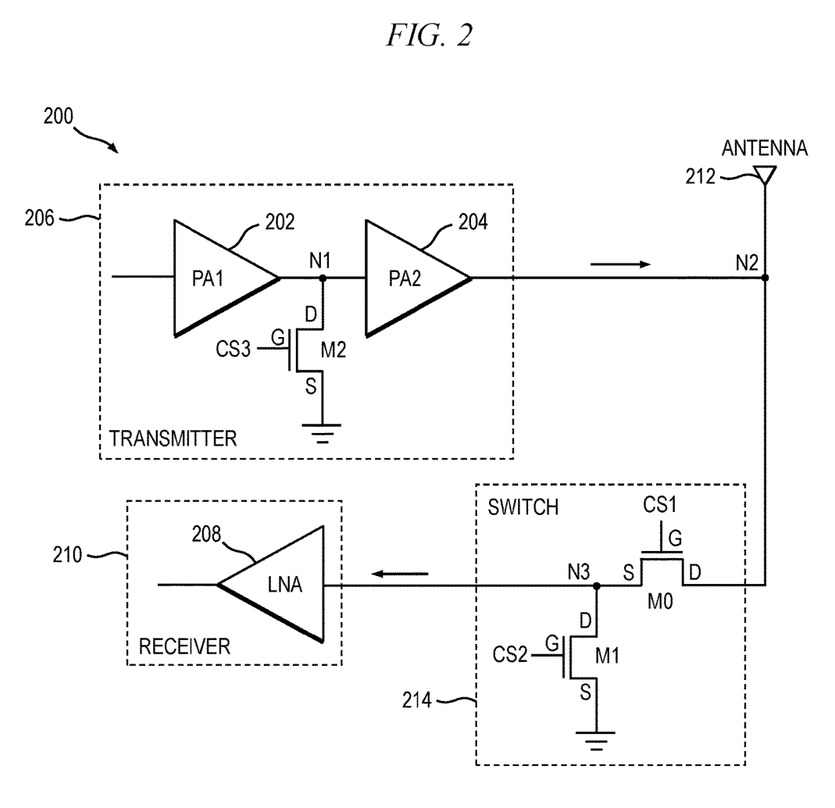
FIG. 2 is a schematic diagram depicting at least a portion of an exemplary FEM, according to an embodiment of the present invention.

Embodiments of the invention address one or more of the above-noted disadvantages by providing an RF switch topology which affords a truly lossless connection between a PA and an antenna in a transmit signal path of an FEM while maintaining superior isolation between the antenna and an LNA in a receive signal path of the FEM. By way of illustration only and without limitation or loss of generality, FIG. 2 is a schematic diagram depicting at least a portion of an exemplary FEM 200, according to an embodiment of the invention. The FEM 200, in this embodiment, comprises a multi-stage PA including a first PA (PA1) 202 and a second PA (PA2) 204, which may be part of transmitter circuitry 206, and an LNA 208, which may be part of receiver circuitry 210. An output of the first PA 202 is coupled to an input of the second PA 204 at a first node N1, and an output of the second PA 204 is coupled directly to an antenna 212 at a second node N2, thereby beneficially eliminating the insertion loss associated with an RF switch typically connected in series between the PA and the antenna. The PAs 202, 204 are preferably fabricated using circuit components (e.g., transistors) able to withstand high voltage (e.g., about 25 volts); that is, devices having a high breakdown voltage. The LNA is preferably fabricated using the same technology as the PAs so that it can be easily integrated with the PAs on the same substrate (e.g., silicon).

The FEM 200 further comprises an RF switch 214 connected between the antenna 212 and an input of the LNA 208 in a receive signal path of the FEM. The RF switch 214 is adapted to selectively couple the LNA to the antenna 212 as a function of one or more control signals supplied to the RF switch. In this embodiment, the RF switch 214 comprises a pair of metal-oxide semiconductor (MOS) devices. Specifically, the RF switch 214 includes a first MOS device, M0, which may be an n-type laterally-diffused metal-oxide semiconductor (LDMOS) field-effect transistor (FET). A drain (D) of transistor M0 is connected with the antenna 212 and the output of the second PA 204 at node N2, a source (S) of M0 is connected with an input of the LNA 208 at a third node N3, and a gate (G) of M0 is adapted to receive a first control signal, CS1. The RF switch 214 further includes a second MOS device, M1, which may also be an n-type LDMOSFET. A drain of transistor M1 is connected with the input of the LNA 208 and source of transistor M0 at node N3, a source of M1 is connected to ground, or an alternative voltage source (e.g., VSS), and a gate of M1 is adapted to receive a second control signal, CS2. Configured in this manner, transistor M0 functions as a pass device and transistor M1 functions as a shunt device. The RF switch 214 is preferably fabricated using circuit components (e.g., transistors) having a high breakdown voltage; preferably, the RF switch is fabricated using the same technology as the PAs 202, 204 and LNA 208 so that it can be easily integrated with the PAs and LNA on the same substrate.

The FEM 200 is operative in one of at least two modes. In a first mode of operation, which may be referred to as a transmit mode, the RF switch 214 is configured to disconnect the LNA 208 from the antenna 212, and the PAs 202 and 204 are enabled for transmitting RF signals. Alternatively, in a second mode of operation, which may be referred to as a receive mode, the RF switch 214 is configured to connect the LNA 208 to the antenna 212 and to disable one or both PAs 202, 204. In one or more embodiments, at least the second PA 204 coupled with the antenna is disabled so as not to inject RF signals into the LNA during the receive mode of operation.

In order to selectively disable the second PA 204, the FEM 200, in one or more embodiments, includes a third MOS device, M2, which may be an n-type LDMOSFET, connected between the input of the second PA and ground. Specifically, a drain of transistor M2 is connected with the input of the second PA 204 at node N1, a source of M2 is connected to ground, and a gate of M2 is adapted to receive a third control signal, CS3. In this configuration, transistor M2 functions as a shunt device. Thus, when transistor M2 is turned on, such as, for example, when M2 is an n-type MOS (NMOS) device and the control signal CS3 supplied to M2 is at a high voltage level (e.g., VDD), the input of the second PA 204 is shunted to ground, thereby disabling the second PA. Transistor M2, although shown as being external to the RF switch 214, may, in one or more embodiments, be implemented as part of the RF switch. Alternatively, in other embodiments, transistor M2 may be incorporated into the second PA 204 as part of a bias or enable circuit of the second PA, such that when an appropriate level control signal is supplied to the second PA, the bias circuit in the second PA is disabled, thereby preventing the second PA from passing RF signals supplied from the antenna 212.

An operation of the FEM 200 will now be described, according to one or more embodiments of the invention, wherein it is assumed that all transistors M0, M1, M2 are NMOS devices. Thus, an active high (e.g., VDD) control signal CS1, CS2 or CS3 supplied to a given transistor M0, M1 or M2, respectively, will turn on (i.e., enable or activate) the transistor. Similarly, an active low (e.g., VSS or ground) control signal supplied to a given one of the transistors will turn off (i.e., disable or deactivate) the transistor. It is to be appreciated that other types of circuit elements may be used to implement the pass and shunt switching devices, with or without modification of the control signal levels, as will become apparent to those skilled in the art. For example, one or more of transistors M0, M1 and M2 may be implemented using a p-type MOS (PMOS) transistor, with a logical complement of the corresponding control signal being used to enable/disable the transistor; that is, an active low control signal is used to turn on the PMOS device and an active high control signal is used to turn off the device.

To receive RF signals in the second mode of operation of the FEM 200, transistor M2 is turned on, by applying an active high control signal CS3 to M2, thereby connecting the input of the second PA 204 (at node N1) to ground, or an alternative voltage source (e.g., VSS). With the input of the second PA 204 shunted to ground, the second PA will be disabled, thus effectively blocking RF signals from a preceding stage in the transmitter 206 from being passed to the antenna 212, and vice versa. A bias circuit (not explicitly shown, but implied) in the second PA 204 may also be disabled so as to reduce overall power consumption in the FEM 200. Next, the shunt transistor M1 in the RF switch 214 is turned off, by applying an active low control signal CS2 to M1, so as to allow node N3 to float, and the pass transistor M0 is turned on, by applying an active high control signal CS1 to M0, to connect the antenna 212 to the input of the LNA 208 at node N3. The LNA 208 is enabled in this mode, so RF signals received from the antenna 212 are amplified by the LNA and passed to a subsequent stage in the receiver 210. Timing of the control signals CS1, CS2 and CS3 is preferably configured according to a prescribed order of activation and/or deactivation of the circuit components (e.g., PAs, LNA, RF switch) in the FEM 200.

To transmit RF power signals to the antenna 212 in the first mode of operation of the FEM 200, the LNA 208 is first disabled. To accomplish this, the pass transistor M0 in the RF switch 214 is turned off, by applying an active low control signal CS1 to M0, thereby disconnecting the input of the LNA 208 from the antenna 212, and the shunt transistor M1 is turned on, by applying an active high control signal CS2 to M1, thereby connecting the input of the LNA at node N3 to ground (or an alternative voltage source). Next, the second PA 204 is enabled by turning on the bias circuit, which includes turning off transistor M2, by applying an active low control signal CS3 to M2, thereby allowing the input to the second PA at node N1 to be defined by the output of the first PA 202. With the second PA 204 enabled, the transmitter 206 can pass RF power signals to the antenna 212. As previously explained, with the output of the second PA 204 coupled to the antenna 212 without any switch element in the transmit signal path, there will be no power loss otherwise attributable to the RF switch.

As previously stated, active devices, such as the devices employed in the PAs 202, 204, LNA 208 and RF switch 214, as well as any active devices external to the primary functional circuits (e.g., transistor M2), are preferably transistors having a high breakdown voltage. For at least this reason, the pass and shunt transistors (e.g., M0, M1, M2) in one or more embodiments are implemented using asymmetric devices, such as diffused metal-oxide semiconductor (DMOS) FETs.

Figure 3:
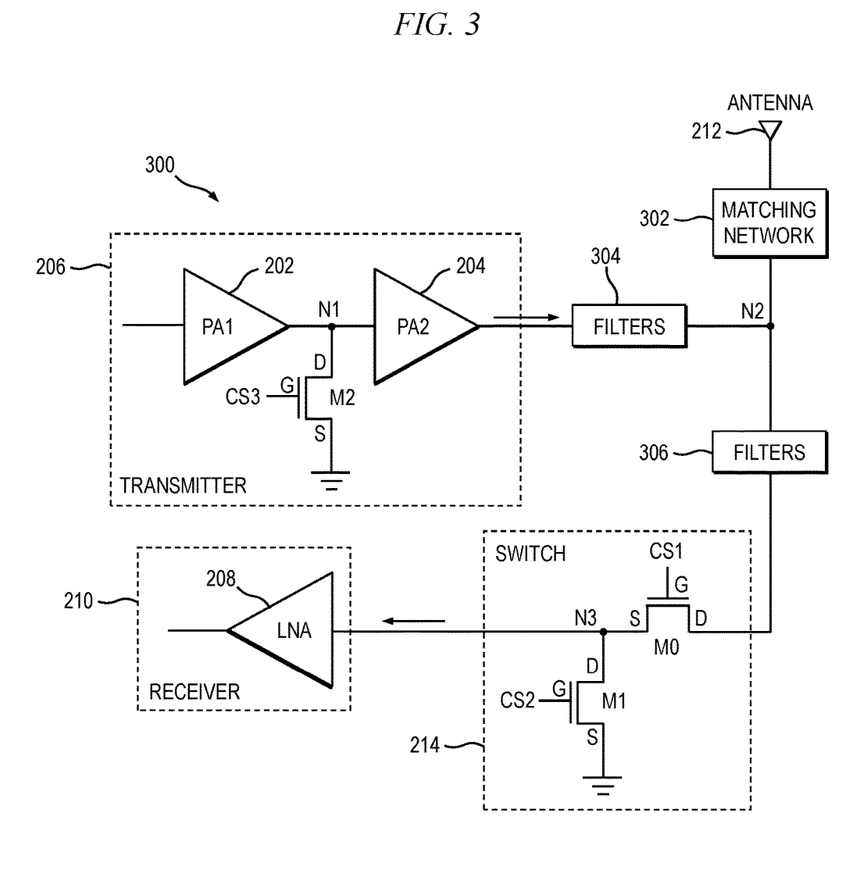
FIG. 3 is a schematic diagram depicting at least a portion of an exemplary FEM including filter and impedance matching circuitry, according to an embodiment of the present invention.

FIG. 3 is a schematic diagram depicting at least a portion of an exemplary FEM 300 including filter and impedance matching circuitry, according to another embodiment of the invention. The FEM 300 is essentially the same as the illustrative FEM 200 shown in FIG. 2, only with the addition of an impedance matching network 302, connected to the antenna 212, and filter circuitry, 304 and 306, connected in the transmit and receive signal paths, respectively. The impedance matching network 302, in this embodiment, is coupled between the antenna 212 and node N2. The matching network 302, in one or more embodiments, comprises passive components (i.e., circuitry) which can be adjusted (i.e., tuned) to match the impedance of at least the second PA 204 for increasing, preferably maximizing, power delivery to the antenna 212. First filter circuitry 304 is connected in the transmit signal path, between the output of the second PA 204 and the antenna matching network 302 at node N2. The first filter circuitry 304, which may comprise, for example, one or more low-pass filters, band-pass filters, or other filter types, is configured to protect the receiver 210 from overload during RF signal transmission, and may also provide signal processing (e.g., signal shaping, pre-distortion, etc.). Likewise, second filter circuitry 306 is connected in the receive signal path, between the RF switch 214 and the matching network 302 at node N2. The second filter circuitry 306, which may comprise for example, one or more low-pass filters, band-pass filters, or other filter types, is configured to protect the prevent unwanted emissions when receiving RF signals.

Figure 4A:
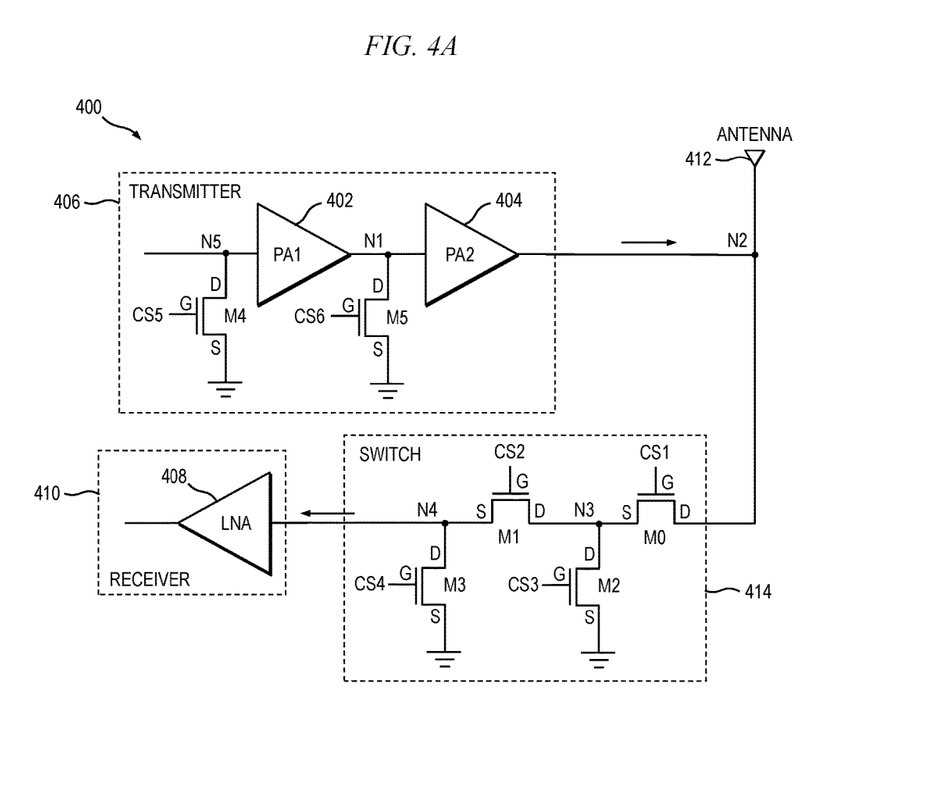
FIG. 4A is a schematic diagram depicting at least a portion of an exemplary FEM which provides enhanced isolation, according to another embodiment of the present invention.

In order to provide improved isolation between the LNA and PA, two or more RF switches can be stacked (i.e., connected in series). With reference now to FIG. 4A, a schematic diagram depicts at least a portion of an exemplary FEM 400 which provides enhanced isolation, according to another embodiment of the invention. The FEM 400, in this embodiment, like in the embodiment shown in FIG. 2, comprises a multi-stage PA including a first PA (PA1) 402 and a second PA (PA2) 404, which may form an output stage of transmitter circuitry 406, and an LNA 408, which may be part of receiver circuitry 410. An output of the first PA 402 is coupled to an input of the second PA 404 at a first node N1, and an output of the second PA 404 is coupled to an antenna 412 at a second node N2 without the inclusion of a switch element in the transmit signal path between the PA and antenna, thus eliminating the insertion loss otherwise associated with an RF switch often connected between the PA and the antenna.

The FEM 400 further comprises an RF switch 414 connected between the antenna 412 and an input of the LNA 408 in a receive signal path of the FEM. The RF switch 414 is adapted to selectively couple the LNA to the antenna 412 as a function of one or more control signals supplied to the RF switch. In this illustrative embodiment, the RF switch 414 comprises four MOS transistors —two functioning as pass devices and two functioning as shunt devices —to provide enhanced isolation between the LNA 408 and the PA 404. It is to be appreciated that embodiments of the invention are not limited to the number of stages employed in the RF switch.

More particularly, the RF switch 414 includes a first MOS pass device, M0, a second MOS pass device, M1, a first MOS shunt device, M2, and a second MOS shunt device, M3, each of which may comprise an n-type LDMOSFET. A drain of transistor M0 is connected with the antenna 412 and the output of the second PA 404 at node N2, a source of M0 is connected with drains of transistors M1 and M2 at a third node N3, and a gate of M0 is adapted to receive a first control signal, CS1. A source of transistor M1 is connected with an input of the LNA 408 and a drain of transistor M3 at a fourth node N4, and a gate of M1 is adapted to receive a second control signal, CS2. Sources of transistors M2 and M3 are connected to ground, or an alternative voltage source (e.g., VSS), a gate of M2 is adapted to receive a third control signal, CS3, and a gate of M3 is adapted to receive a fourth control signal, CS4. Like the RF switch 214 shown in FIG. 2, the RF switch 414 is preferably fabricated using circuit components (e.g., transistors) having a high breakdown voltage; preferably, the RF switch is fabricated using the same technology as the PAs 402, 404 and LNA 408 so that it can be easily integrated with the PAs and LNA on the same substrate.

The FEM 400 is operative in one of at least two modes. In a manner consistent with the FEM 200 depicted in FIG. 2, in a first mode of operation, which may be referred to as a transmit mode, the RF switch 414 is configured to disconnect the LNA 408 from the antenna 412, and the PAs 402 and 404 are enabled for transmitting RF signals. Alternatively, in a second mode of operation, which may be referred to as a receive mode, the RF switch 414 is configured to connect the LNA 408 to the antenna 412 and to disable one or both PAs 402, 404. In this embodiment, both the first and second PAs 402 and 404, respectively, are disabled to provide improved isolation during the receive mode of operation compared to the FEM 200 of FIG. 2.

In order to selectively disable the first and second PAs, the FEM 400, in one or more embodiments, includes two MOS transistors functioning as shunt devices, each of which may comprise an n-type LDMOSFET. More particularly, a third MOS shunt device, M4, is connected between the input of the first PA 402 and ground, and a fourth MOS shunt device, M5, is connected between the input of the second PA 404 and ground. Specifically, a drain of transistor M4 is connected with the input of the first PA 404 at a fifth node N5, a source of M4 is connected to ground, and a gate of M4 is adapted to receive a fifth control signal, CS5. Likewise, a drain of transistor M5 is connected with the output of the first PA 402 and the input of the second PA 404 at node N1, a source of M5 is connected to ground, and a gate of M5 is adapted to receive a sixth control signal, CS6. When n-type LDMOS transistors M4 and M5 are turned on, such as, for example, when the control signals CS5 and CS6 applied to M4 and M5, respectively, are at a high voltage level (e.g., VDD), the inputs of the first and second PAs 402, 404 are shunted to ground, thereby disabling the PAs. Transistors M4 and M5, although shown as being external to the RF switch 414, may, in one or more embodiments, be implemented as part of the RF switch. Alternatively, in other embodiments, transistors M4 and M5 may be incorporated into a corresponding PA as part of a bias or enable circuit of the PA, such that when an appropriate level control signal is applied to the PAs, the bias circuits in the first and second PAs are disabled, thereby preventing the PA from passing RF signals supplied thereto to the antenna 412.

An operation of the FEM 400 will be consistent with the operation of the FEM 200 previously described in conjunction with FIG. 2, except for the additional control signals in the RF switch 414 and transmitter 406. Specifically, in one or more embodiments, to receive RF signals in the second mode of operation of the FEM 400, transistors M4 and M5 are turned on, by applying active high control signals CS5 and CS6 to M4 and M5, respectively, thereby connecting the input of the first PA 402, at node N5, and the input of the second PA 404, at node N1, to ground, or an alternative voltage source (e.g., VSS). In one or more embodiments, the shunt devices M4 and M5 are turned on at the same time, and thus control signals CS5 and CS6 may be implemented using the same signal. In one or more alternative embodiments, a delay may be introduced between disabling of the first and second PAs, in which case the control signals CS5 and CS6 will be different relative to one another (although the two signals may still share a common generation source, such as, for example, being different phases of a common clock signal). With their inputs shunted to ground, the PAs 402, 404 will be disabled, thus effectively blocking RF signals from a preceding stage in the transmitter 406 from being passed to the antenna 412, and vice versa. One or more bias circuits (not explicitly shown, but implied) in the first and second PAs 402, 404 may also be disabled so as to reduce overall power consumption in the FEM 400.

Next, the shunt transistors M2 and M3 in the RF switch 414 are turned off, such as by applying active low control signals CS3 and CS4 to M2 and M3, respectively, so as to allow nodes N3 and N4 to float. In one or more embodiments, the shunt devices M2 and M3 are turned off at the same time, and thus control signals CS3 and CS4 may be implemented using the same signal. In one or more other embodiments, a delay may be introduced between disabling of transistors M2 and M3, in which case the control signals CS3 and CS4 will be different relative to one another. The pass transistors M0 and M1 are turned on, such as by applying active high control signals CS1 and CS2 to M0 and M1, respectively, to couple the antenna 412 to the input of the LNA 408. The two pass devices M0 and M1 provide multiple stages of isolation between the LNA 408 and the PAs 402, 404. The LNA 408 is enabled in this mode, so RF signals received from the antenna 412 are amplified by the LNA and passed to a subsequent stage in the receiver 410. Timing of the control signals CS1 through CS6 is preferably configured according to a prescribed order of activation and/or deactivation of the circuit components (e.g., PAs, LNA, RF switch) in the FEM 400.

It is to be appreciated that the insertion loss introduced by the additional pass device stage in the RF switch 414 will be insignificant due, at least in part, to the low current flowing through the pass devices in the receive signal path. In some applications, the higher isolation (i.e., lower noise) performance benefit achieved through the use of multiple RF switch stages will far outweigh any increase in insertion loss in the receive signal path. More critical is the beneficial elimination of switch elements in the transmit signal path, according to embodiments of the invention, since there will generally be a larger current flowing in the transmit signal path.

Similarly, to transmit RF power signals to the antenna 412 in the first mode of operation of the FEM 400, the LNA 408 is first disabled. To accomplish this, the pass transistors M0 and M1 in the RF switch 414 are turned off, by applying an active low control signals CS1 and CS2 to M0 and M1, respectively, thereby disconnecting the input of the LNA 408 from the antenna 412. The shunt transistors M2 and M3 are turned on, such as by applying active high control signals CS3 and CS3 to M2 and M3, respectively, thereby connecting the input of the LNA at node N4 to ground (or an alternative voltage source). The PAs 402 and 404 are then enabled by turning on the bias circuit in each of the PAs, which includes turning off shunt transistors M4 and M5, such by applying active low control signal CS5 and CS6 to M4 and M5, respectively. In one or more embodiments, the shunt devices M4 and M5 are turned off at the same time, and thus control signals CS5 and CS6 may be implemented using the same signal. In one or more other embodiments, a delay may be introduced between disabling of the transistors M4 and M5, in which case the control signals CS5 and CS6 will be different relative to one another. With the first and second PAs 402, 404 enabled, the transmitter 406 can pass RF power signals to the antenna 412. As previously stated, without any switch element in the transmit signal path between the second PA 404 and the antenna 412, there will be no power loss otherwise attributable to the RF switch.

The table below provide a summary of the status of the transistors in the RF switch 414 and transmitter 406 for both transmit and receive modes of operation in the FEM 400, according to one or more embodiments of the invention.

|  | Transmit Mode | Receive Mode |
| --- | --- | --- |
| M0 | Off | On |
| M1 | Off | On |
| M2 | On | Off |
| M3 | On | Off |
| M4 | Off | On |
| M5 | Off | On |

Figure 4B:
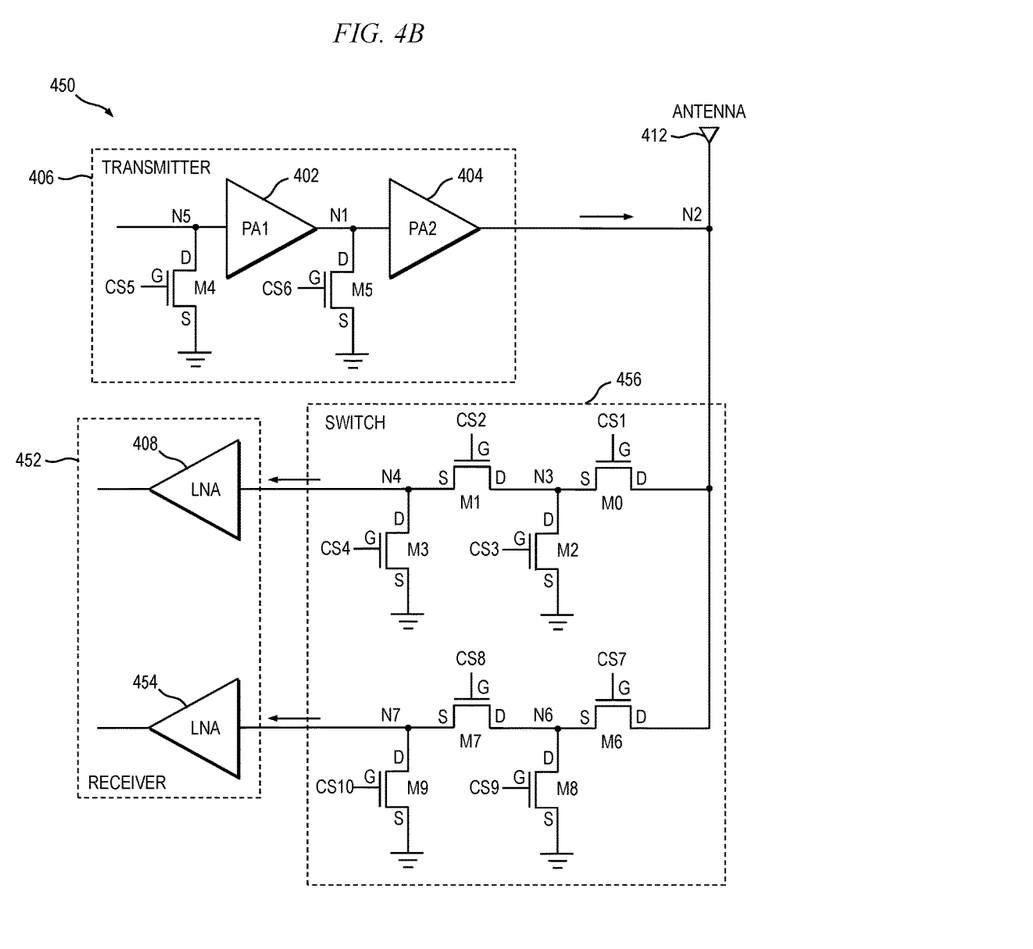
FIG. 4B is a schematic diagram depicting at least a portion of an exemplary FEM which includes multiple receiver stages, according to an embodiment of the present invention.

While a receiver including only a single LNA is shown in FIGS. 2 and 4A, aspects of the invention are similarly applicable to a receiver having multiple LNAs. By way of example only, FIG. 4B is a schematic diagram depicting at least a portion of an exemplary FEM 450 which includes multiple receiver stages, according to an embodiment of the invention. The FEM 450 is essentially the same as FEM 400 shown in FIG. 4A, except for the inclusion of an addition LNA and corresponding switch circuitry. Specifically, focusing on the receive signal path, the exemplary FEM 450 comprises a receiver 452 which includes a first LNA 408 and a second LNA 454. In one or embodiments, the first and second LNAs 408, 454 may be identical to one another or, in other embodiments, the first and second LNAs may be different (e.g., different gains, impedance, etc.).

The FEM 450 further comprises an RF switch 456 connected between the antenna 412 and an input of each of the LNAs 408 and 454 in corresponding receive signal paths of the FEM. The RF switch 456 is configured to selectively couple the LNAs 408 and 454 to the antenna 412 as a function of corresponding control signals supplied to the RF switch. In this illustrative embodiment, each receive signal path of the RF switch 456 comprises four MOS transistors —two functioning as pass devices and two functioning as shunt devices —to provide enhanced isolation, compared to the illustrative switch 214 shown in FIG. 2, between the corresponding LNAs 408, 454 and the PA 404. It is to be appreciated that embodiments of the invention are not limited to the number of stages employed in the RF switch.

More particularly, the RF switch 456 includes first switch circuitry connected in a first receive signal path between the first LNA 408 and the antenna 412, and second switch circuitry connected in a second receive signal path between the second LNA 454 and the antenna 412. The first switch circuitry in the RF switch 456 is implemented consistent with the RF switch 414 shown in FIG. 4A and includes a first MOS pass device, M0, a second MOS pass device, M1, a first MOS shunt device, M2, and a second MOS shunt device, M3, each of which may comprise an n-type LDMOSFET. A drain of transistor M0 is connected with the antenna 412 and the output of the second PA 404 at node N2, a source of M0 is connected with drains of transistors M1 and M2 at a third node N3, and a gate of M0 is adapted to receive a first control signal, CS1. A source of transistor M1 is connected with an input of the first LNA 408 and a drain of transistor M3 at a fourth node N4, and a gate of M1 is adapted to receive a second control signal, CS2. Sources of transistors M2 and M3 are connected to ground, or an alternative voltage source (e.g., VSS), a gate of M2 is adapted to receive a third control signal, CS3, and a gate of M3 is adapted to receive a fourth control signal, CS4.

Similarly, the second switch circuitry in the RF switch 456 includes a first MOS pass device, M6, a second MOS pass device, M7, a first MOS shunt device, M8, and a second MOS shunt device, M9, each of which may comprise an n-type LDMOSFET. A drain of transistor M6 is connected with the antenna 412 and the output of the second PA 404 at node N2, a source of M6 is connected with drains of transistors M7 and M8 at node N6, and a gate of M6 is adapted to receive a seventh control signal, CS7. A source of transistor M7 is connected with an input of the second LNA 454 and a drain of transistor M9 at node N7, and a gate of M7 is adapted to receive an eighth control signal, CS8. Sources of transistors M8 and M9 are connected to ground, or an alternative voltage source (e.g., VSS), a gate of M8 is adapted to receive a ninth control signal, CS9, and a gate of M9 is adapted to receive a tenth control signal, CS10.

The control signals CS7-CS10 supplied to the second switch circuitry may be different than the control signals CS1-CS4 supplied to the first switch circuitry in the RF switch 456, so that the first and second switch circuitry can be independently controlled. In other embodiments, the first and second switch circuitry in the RF switch 456 are controlled by the same set of control signals. In the latter embodiment, for example, control signals CS7 and CS1 are the same, control signals CS8 and CS2 are the same, control signals CS9 and CS3 are the same, and control signals CS10 and CS4 are the same. The operation of each of the first and second switch circuitry in the RF switch 456 is preferably consistent with the operation of the RF switch 414 previously described in conjunction with FIG. 4A.

Like the RF switch 214 shown in FIG. 2, the RF switch 456 is preferably fabricated using circuit components (e.g., transistors) having a high breakdown voltage; preferably, the RF switch is fabricated using the same technology as the PAs 402, 404 and LNAs 408, 454 so that it can be easily integrated with the PAs and LNAs on the same substrate.

Figure 5:
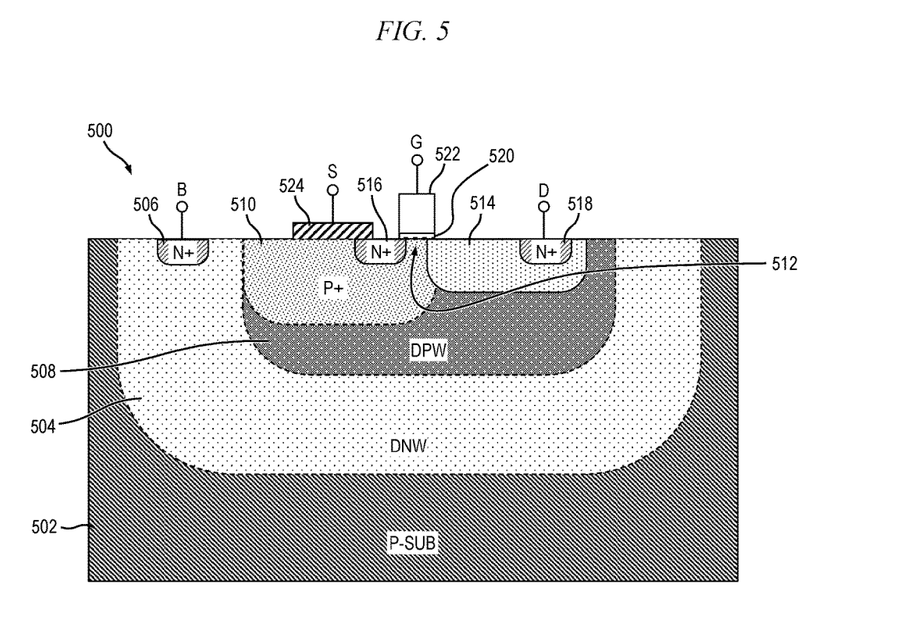
FIG. 5 is a cross-sectional view depicting at least a portion of an exemplary power LDMOS transistor device suitable for use in an FEM, according to an embodiment of the invention.

In one or more embodiments, one or more of the MOS transistors used in the RF switch (e.g., RF switch 214, 414 or 456 shown in FIG. 2, 4A or 4B, respectively) can be isolated from other circuit devices by using a deep n-type well or an n-type buried layer. By way of example only and without limitation, FIG. 5 is a cross-sectional view depicting at least a portion of an exemplary power LDMOS transistor device 500 suitable for use in an FEM, according to an embodiment of the invention. The LDMOS device 500 includes a substrate 502 which, in one or more embodiments, is formed of single-crystalline silicon (e.g., having a <100> or <111> crystal orientation). Suitable alternative materials for forming the substrate 502 may also be used, such as, but not limited to, germanium, silicon germanium, silicon carbide, gallium arsenide, gallium nitride, or the like. Additionally, in one or more embodiments the substrate 502 is preferably modified by adding an impurity or dopant (e.g., boron, phosphorus, arsenic, etc.) to change a conductivity of the material (e.g., n-type or p-type). In one or more embodiments, where the LDMOS device 500 is an n-channel transistor, the substrate 502 is of p-type conductivity and may thus be referred to as p-substrate (P-SUB). A p-substrate may be formed by adding a p-type impurity or dopant (e.g., Group III elements, such as boron) of a prescribed concentration level (e.g., about $10^{14}$ to $10^{19}$ atoms per cubic centimeter) to the substrate material, such as by using a diffusion or implant step, to change the conductivity of the material as desired. In one or more alternative embodiments, where the LDMOS device 500 is a p-channel transistor, an n-type substrate (N-SUB) may be formed by adding an n-type impurity or dopant (e.g., Group V elements, such as phosphorus) of a prescribed concentration level to the substrate material.

The LDMOS device 500, in this embodiment, further includes a deep n-type well or n-well (DNW) 504 formed in the substrate 502. As is known by those skilled in the art, well formation, in one or more embodiments, typically includes oxidation of the wafer at high temperature (e.g., about 1100° C.) to form an oxide layer (e.g., $SiO_2$) on the upper surface of the wafer. A photoresist layer is then deposited on the oxide layer and is patterned, using an n-well mask in a photolithographic process, and etched (e.g., using a wet etchant, such as hydrofluoric acid (HF)) to create an opening through the oxide layer defining where the deep n-well 504 is to be formed. The n-well 504 is formed by adding an n-type impurity of a prescribed doping level to the underlying substrate 502 through the n-well opening in the oxide layer, such as by diffusion or implantation. The oxide layer is then stripped from the upper surface of the wafer and processing continues. A heavily-doped region 506 having a conductivity type the same as the deep n-well 504 is formed proximate the upper surface of the substrate and within the deep n-well to form a body (B) contact of the LDMOS device 500.

A deep p-type well or p-well (DPW) 508 is formed within the n-well 504, proximate the upper surface of the substrate. The p-well 508, which is at a shallower depth compared to the deep n-well 504, may be formed in a manner consistent with the formation of the deep n-well 504, only rather than adding an n-type impurity, as in the case of the n-well, a p-type impurity of a prescribed doping level is added to a defined region within the n-well to change the conductivity type. A p-n junction between the deep p-well 508 and the deep n-well 504 is used to isolate the structure from the substrate 502. The boundaries of the deep n-well 504 and deep p-well 508 are shown as dotted lines, primarily because the well boundaries are not necessarily sharp. Specifically, the p-n junction between the two wells is actually a depletion region, with the thicknesses of the n-well 504 and p-well 508 dependent on the dopant concentrations of the respective n- and p-regions. The p-well 508 also serves as the well in which an NMOS transistor device is formed.

A body region 510, which in this embodiment is of p-type conductivity (p-body), is formed proximate the upper surface of the substrate 502 and within the deep p-well 508, starting from an edge of the deep p-well 504 closest to a source side of the device and extending laterally toward a drain side of the device. The body region 510, in one or more embodiments, is formed using a deep diffusion or implant step from the source side, extending laterally to form a graded channel region 512 in the device 500. A lightly-doped drain (LDD) region 514 is formed proximate the upper surface of the substrate 502 within the deep p-well 508 and laterally adjacent to the p-body region 510. The LDD region 514 if formed having a conductivity type which is opposite that of the body region 510; in this embodiment, n-type conductivity.

Source and drain regions 516 and 518, respectively, are formed proximate the upper surface of the substrate 502 and spaced laterally from one another; the source region being formed in the body region 510 and the drain region being formed in the LDD region 514. The source and drain regions 516, 518 are preferably doped, such as by a conventional implant step, with an impurity of a known concentration level to selectively change the conductivity of the material as desired. In one or more embodiments, the source and drain regions 516, 518 have a conductivity type associated therewith which is opposite a conductivity type of the deep p-well 508, so that active regions can be formed in the device. In the embodiment shown in FIG. 5, the source and drain regions 516, 518 are of n-type conductivity.

A thin dielectric layer 520 is formed on the upper surface of the substrate 502. The thin dielectric layer 520 may comprise an insulating material, such as, for example, silicon dioxide ($SiO_2$), that is grown or deposited on the upper surface of the substrate to a desired thickness (e.g., about 50-400 angstroms). A gate 522, which, in one or more embodiments, comprises a polycrystalline silicon (polysilicon) layer, is formed over the thin dielectric layer 520, such as, for example, using a chemical vapor deposition (CVD) technique. The thin dielectric layer 520 under the gate 522 is commonly referred to as "gate oxide," since it often comprises an oxide which electrically isolates the gate 522 from the drain and/or source regions of the device. The polysilicon layer is generally patterned using, for example, a conventional photolithographic process, and followed by an etching step (e.g., dry etching) to form the gate 520, as will be understood by those skilled in the art.

Figure 6:
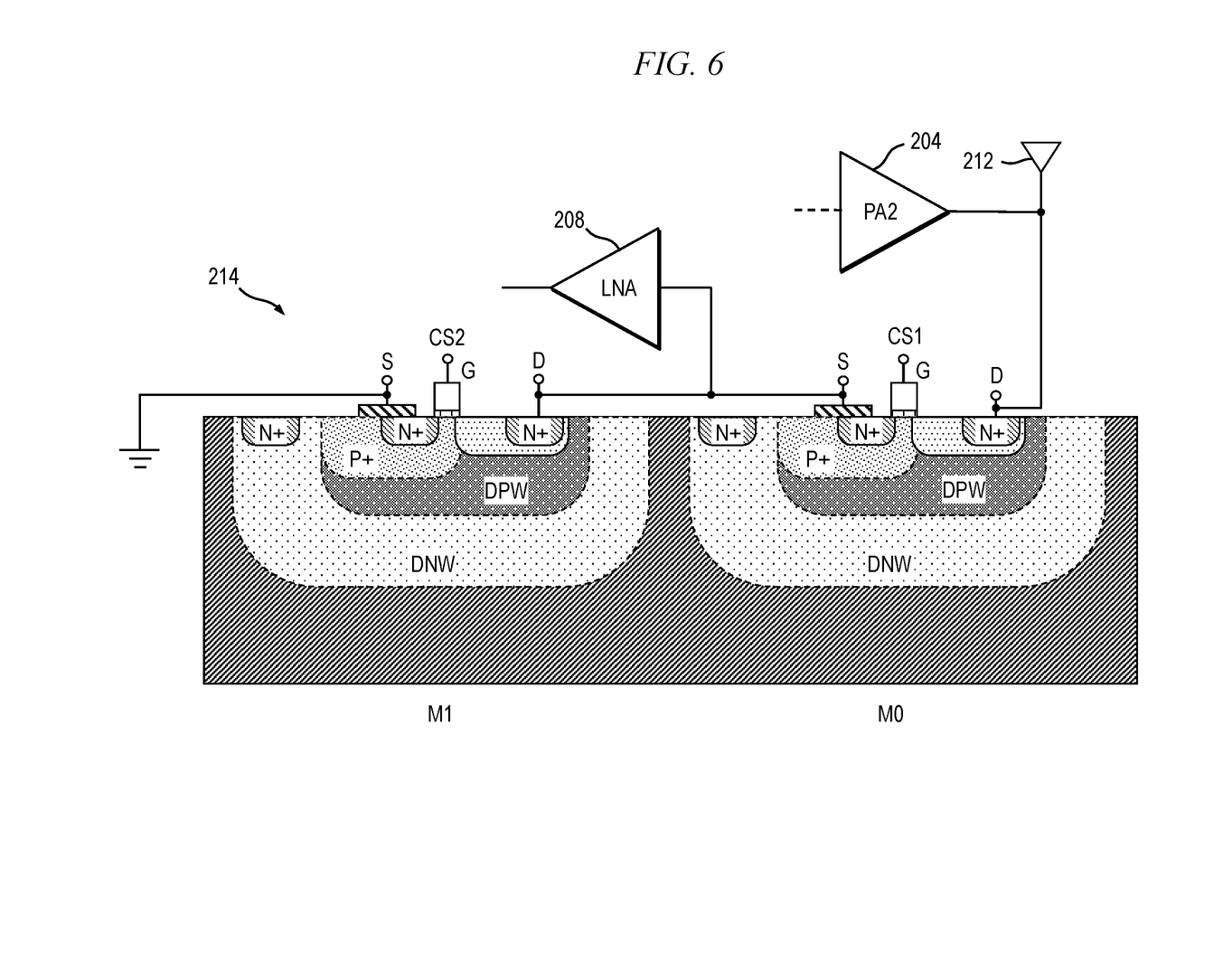
FIG. 6 is a cross-sectional view depicting at least a portion of an exemplary layout of the LDMOS transistors M0 and M1 in the illustrative RF switch shown in FIG. 2, according to an embodiment of the invention.

FIG. 6 is a cross-sectional view depicting at least a portion of an exemplary layout of the LDMOS transistors M0 and M1 in the illustrative RF switch 214 shown in FIG. 2, according to an embodiment of the invention. With reference to FIGS. 5 and 6, the LDMOSFETs in the deep n-well (DNW), or n-type buried layer (NBL), used in the RF switch 214 are connected, in this embodiment, in the following manner. The source and body (B) of the pass transistor M0 are connected to the input of the LNA 208, while the drain of M0 is connected to the antenna 212 and the output of the PA 204. The drain of the shunt transistor M1 is connected to the source of transistor M0, and the source and body of M1 are connected to ground.

Given the discussion thus far, it will be appreciated that an exemplary integrated FEM includes at least one PA coupled to an antenna without inclusion of a switching element in a transmit signal path in the FEM between an output of the PA and the antenna. The FEM further includes at least one LNA and a switching circuit coupled in a receive signal path of the FEM between the antenna and an input of the LNA. The switching circuit is configured in a first mode to disable the PA and to connect the input of the LNA to the antenna for receiving signals from the antenna. The switching circuit is further configured in a second mode to disconnect the input of the LNA from the antenna and to enable the PA for transmitting signals to the antenna. In one or more embodiments, the switching circuit includes at least a first pass transistor and at least a first shunt transistor. The pass transistor is connected between the antenna and the input of the LNA and selectively connects the input of the LNA to the antenna as a function of a first control signal. The shunt transistor is connected between the input of the LNA and a first voltage source and selectively connects the input of the LNA to the first voltage source as a function of a second control signal.

Given the discussion thus far, it will also be appreciated that an integrated circuit includes a semiconductor substrate and at least one FEM formed on the substrate. The FEM includes at least one PA coupled to an antenna without inclusion of a switching element in a transmit signal path between an output of the PA and the antenna. The FEM further includes at least one LNA and a switching circuit coupled in a receive signal path between the antenna and an input of the LNA. The switching circuit is configured in a first mode to disable the PA and to connect the input of the LNA to the antenna for receiving signals from the antenna. The switching circuit is further configured in a second mode to disconnect the input of the LNA from the antenna and to enable the PA for transmitting signals to the antenna. In one or more embodiments, the integrated circuit further includes a first well of a second conductivity type formed in the substrate and proximate an upper surface of the substrate, and a second well of the first conductivity type formed within the first well and proximate the upper surface of the substrate, the first well having a depth in the substrate that is greater than a depth of the second well. A least one transistor included in the switching circuit is formed in the second well, a p-n junction between the first and second wells electrically isolating the transistor from the substrate.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having a lossless connection between a PA and an antenna in an FEM, in accordance with one or more embodiments of the invention.

An integrated circuit in accordance with aspects of the present disclosure can be employed in essentially any application and/or electronic system where high-frequency power semiconductor devices (e.g., RF power amplifiers) are employed. Suitable systems and devices for implementing embodiments of the invention may include, but are not limited to, portable electronics (e.g., cell phones, tablet computers, etc.). Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower," "front" and "back" are used to indicate relative positioning of elements or structures to each other when such elements are oriented in a particular manner, as opposed to defining absolute positioning of the elements.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An integrated front-end module (FEM), comprising:
at least one power amplifier (PA) coupled to an antenna without inclusion of a switching element in a transmit signal path in the FEM between an output of the PA and the antenna;
at least one shunt transistor connected to an input of the at least one PA;
at least a first low-noise amplifier (LNA); and
a switching circuit coupled in a receive signal path of the FEM between the antenna and an input of the first LNA, the switching circuit being configured in a first mode to activate the at least one shunt transistor to thereby disable the PA and to connect the input of the first LNA to the antenna for receiving signals from the antenna, the switching circuit being configured in a second mode to disconnect the input of the first LNA from the antenna and to deactivate the at least one shunt transistor to thereby enable the PA for transmitting signals to the antenna.

2. The FEM of claim 1, wherein the switching circuit comprises:
at least a first pass transistor connected between the antenna and the input of the first LNA, the first pass transistor selectively connecting the input of the first LNA to the antenna as a function of a first control signal; and
at least a first shunt transistor connected between the input of the first LNA and a first voltage source, the first shunt transistor selectively connecting the input of the first LNA to the first voltage source as a function of a second control signal.

3. The FEM of claim 2, wherein in the first mode, the first pass transistor is turned on and the first shunt transistor is turned off, and in the second mode, the first pass transistor is turned off and the first shunt transistor is turned on.

4. The FEM of claim 3, wherein in the first mode, the first and second control signals are configured such that the first pass transistor is turned on after the first shunt transistor is turned off, and in the second mode, the first and second control signals are configured such that the first pass transistor is turned off before the first shunt transistor is turned on.

5. The FEM of claim 2, wherein the at least one PA comprises a bias circuit, the bias circuit being selectively enabled as a function of a third control signal, and wherein in the first mode, the first pass transistor is turned on, the first shunt transistor is turned off and the bias circuit is disabled, and in the second mode, the first pass transistor is turned off, the first shunt transistor is turned on, and the bias circuit is enabled.

6. The FEM of claim 5, wherein in the first mode, the first, second and third control signals are configured such that the first pass transistor is turned on after the first shunt transistor is turned off and the bias circuit is disabled, and in the second mode, the first, second and third control signals are configured such that the first pass transistor is turned off before the first shunt transistor is turned on and the bias circuit is enabled.

7. The FEM of claim 2, wherein each of at least a subset of the transistors in the switching circuit comprises an n-type laterally-diffused metal-oxide semiconductor (LDMOS) transistor.

8. The FEM of claim 1, further comprising:
at least one filter circuit operatively coupled between the antenna and at least one of the PA and the first LNA; and
an impedance matching network connected to the antenna and configured to match an impedance of the PA for thereby increasing power delivery to the antenna.

9. The FEM of claim 1, wherein the switching circuit comprises:
a plurality of pass transistors connected in series between the antenna and the input of the first LNA, the pass transistors selectively connecting the input of the first LNA to the antenna as a function of at least first control signals; and
a plurality of shunt transistors, a first one of the plurality of shunt transistors coupled between the input of the first LNA and a first voltage source, and at least a second one of the plurality of shunt transistors coupled between adjacent pass transistors and the first voltage source, the shunt transistors selectively connecting a corresponding node in the switching circuit to the first voltage source as a function of at least second control signals.

10. The FEM of claim 1, wherein the at least one PA, the at least first LNA and the switching circuit are formed on a same substrate.

11. The FEM of claim 1, wherein an output of the at least one PA is connected directly to the antenna.

12. The FEM of claim 1, wherein the at least one PA comprises a multi-stage PA including a plurality of PA stages connected together in series in the transmit signal path.

13. The FEM of claim 12, wherein in the first mode, at least a given one of the plurality of PA stages connected to the antenna is disabled, and in the second mode, each of the plurality of PA stages is enabled.

14. The FEM of claim 1, further comprising a plurality of LNAs having respective receive signal paths associated therewith, each of the LNAs having an input that is selectively connected to the antenna through the switching circuit, the switching circuit being configured in the first mode to disable the PA and to connect at least one of the plurality of LNAs to the antenna for receiving signals from the antenna, the switching circuit being configured in the second mode to disconnect the respective inputs of the plurality of LNAs from the antenna and to enable the PA for transmitting signals to the antenna.

15. The FEM of claim 14, wherein the switching circuit is configured in the first mode to connect at least two of the plurality of LNAs to the antenna.

16. The FEM of claim 1, further comprising a second LNA, the second LNA having an input coupled with the switching circuit, the switching circuit being configured in the first mode to disable the PA, to connect the input of the first LNA to the antenna for receiving signals from the antenna, and to disconnect the input of the second LNA from the antenna, the switching circuit being configured in the second mode to disconnect the inputs of the first and second LNAs from the antenna and to enable the PA for transmitting signals to the antenna, the switching circuit being configured in a third mode to disable the PA, to connect the input of the second LNA to the antenna for receiving signals from the antenna, and to disconnect the input of the first LNA from the antenna.

17. An integrated front-end module (FEM), comprising:
at least one power amplifier (PA) coupled to an antenna without inclusion of a switching element in a transmit signal path in the FEM between an output of the PA and the antenna;
at least one shunt device connected to an input of the at least one PA, the shunt device being external to the PA and being configured to selectively shunt the input of the PA to ground as a function of at least a first control signal supplied to the at least one shunt device;
at least a first low-noise amplifier (LNA); and
a switching circuit coupled between the antenna and an input of the first LNA, the switching circuit being configured in a first mode to supply the at least first control signal for activating the at least one shunt device to thereby disable the PA and to connect the input of the first LNA to the antenna for receiving signals from the antenna, the switching circuit being configured in a second mode to disconnect the input of the first LNA from the antenna and to supply the at least first control signal for deactivating the at least one shunt device to thereby enable the PA for transmitting signals to the antenna.

18. The FEM of claim 17, wherein the at least one PA comprises at least first and second PAs, an output of the first PA being connected to an input of the second PA, and an output of the second PA being coupled with the antenna, the at least one shunt device comprising a first n-type metal-oxide-semiconductor (NMOS) transistor having a drain connected to the input of the second PA, a source connected to ground, and a gate adapted to receive the first control signal supplied by the switching circuit.

19. The FEM of claim 18, wherein the at least one shunt device further comprises a second NMOS transistor, the second NMOS transistor having a drain connected to an input of the first PA, a source connected to ground, and a gate adapted to receive a second control signal supplied by the switching circuit, the second NMOS transistor being activated in the first mode as a function of the second control signal to thereby disable the first PA, the second NMOS transistor being deactivated in the second mode as a function of the second control signal to thereby enable the first PA for transmitting signals to the second PA.

20. The FEM of claim 19, wherein the switching circuit is configured to control a timing of the first and second control signals relative to one another such that a delay is introduced between disabling of the first and second PAs.

* * * * *